Figure 1:
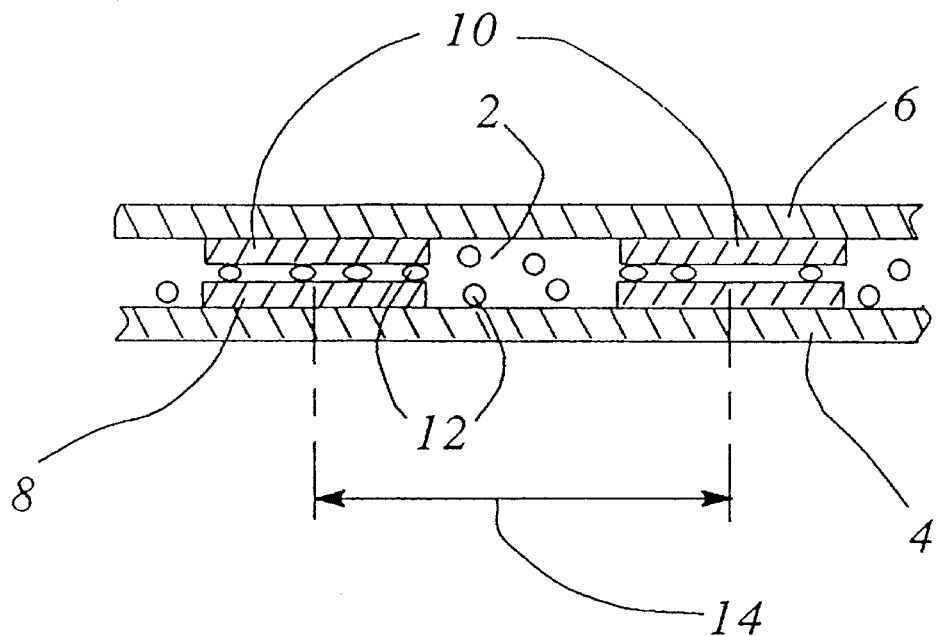

United States Patent [19]

Naylor

[11] Patent Number: 5,613,862

[45] Date of Patent: Mar. 25, 1997

[54] ANISOTROPIC ELECTRICAL CONNECTION

[75] Inventor: Malcolm Naylor, Slough, Great Britain

[73] Assignee: Central Research Laboratories Limited, Middlesex, England

[21] Appl. No.: 230,945

[22] Filed: Apr. 21, 1994

[51] Int. Cl.$^6$ ........................................... H01R 4/58
[52] U.S. Cl. ........................................ 439/91; 174/94 R
[58] Field of Search ........................... 439/390, 936, 439/387, 389, 91; 174/66, 94 R

[56] References Cited

U.S. PATENT DOCUMENTS

| | | | |
|---|---|---|---|
| 4,449,774 | 4/1984 | Takashi et al. | 439/91 OR |
| 4,652,973 | 3/1987 | Baker et al. | 439/91 X |
| 4,814,040 | 3/1989 | Ozawa . | |
| 5,001,302 | 3/1991 | Atsumi | 439/91 X |
| 5,141,444 | 8/1992 | Redmond et al. | 439/91 X |
| 5,358,412 | 10/1994 | Maurinus et al. | 439/66 OR |

FOREIGN PATENT DOCUMENTS

| | | |
|---|---|---|
| 0428165 | 5/1991 | European Pat. Off. . |
| 2549627 | 1/1985 | France . |
| 2131814 | 6/1984 | United Kingdom . |

OTHER PUBLICATIONS

WPAT English language summary of Japanese patent publication 61-98,781, "New Conductive Adhesive – for e.g. Attaching Conductors to Quartz Resonators", published May 17, 1986, AN 86-165,888/26.

Abstract of Japanese patent publication 61-98,781, "Electrically Conductive Adhesive", Patent Abstracts of Japan, vol. 10,280, Sep. 24, 1986.

Primary Examiner—P. Austin Bradley
Assistant Examiner—Daniel Wittels
Attorney, Agent, or Firm—Keck, Mahin & Cate

[57] ABSTRACT

A method of forming an anisoptropic electrical connection between conductive elements (22, 24) having an oxide layer (28) is disclosed. The method comprises the use of an adhesive (30) including carbon fibres (32) and metallic particles (34). On the application of pressure, the carbon fibres (32) penetrate the oxide layer (28), whilst the metallic particles (34) deform such that a good electrical connection is made between overlying elements (22, 24).

6 Claims, 1 Drawing Sheet

ANISOTROPIC ELECTRICAL CONNECTION

This invention relates to anisotropic electrical connection, and in particular to an adhesive for the anisotropic electrical connection of electrically conductive elements.

More specifically, the invention relates to the electrical interconnection of aligned conductive elements mounted respectively on first and second substrates, without electrical interconnection between adjacent conductors on each substrate.

This is a common requirement, for example, in the production of LCDs or other display panels. In this case, one substrate may be the glass display panel, the electrically conductive elements mounted thereon commonly being formed of a transparent oxide of indium and tin (ITO). The required interconnection is that of the ITO elements to a circuit board for supplying the required driving voltages.

One well established technique for achieving this interconnection is the use of a substrate of thin flexible material in the form of a strip carrying tracks of metal or conductive ink. The strip is bonded to the glass substrate at one end, and to the circuit board at the other end. Alternatively, the circuit board may be incorporated on the strip. Electrical interconnection is achieved by the use of an adhesive substance which forms an anisotropic connection in bonding. The substance comprises an adhesive polymer in which metallic particles are suspended.

This known method of connecting ITO conductors is shown diagrammatically in FIG. 1 of the accompanying drawings. The adhesive 2 is sandwiched between the end of the flexible strip 4 and the edge of the glass display panel 6, with the conductive elements 8, 10 aligned. Heat and pressure are applied to the joint, such that the metallic particles 12 deform between the aligned conductors 8, 10 on the panel 6 and the flexible substrate 4 forming an electrically conductive pathway therebetween. The adhesive is then cured or set by heat to maintain the conductive pathways. Since the metallic particles 12, are small compared to the gap between the conductive elements 8, 10 on each substrate 4, 6 electrical connection is not made between adjacent conductors 8 or 10.

With the fast rate of addressing which is possible with FLCD (ferro-electric liquid crystal display) technology, it is preferable to use low resistive conductive elements or electrodes on the display substrate. This can be achieved by adding a much narrower metal conductor to each ITO element to increase its conductivity, or by replacing the ITO elements with metallic elements where transparency is not required, for example in printer applications or outside of the active display area.

Aluminium is suitable for this purpose due to its high electrical conductivity. However, connection of aluminium conductors using the method described above has been found to be unreliable. This appears to be due to the non-conductive oxide which forms on the surface of aluminium, the metallic particles merely being squashed when the substrates are pressed together in bonding thus distributing the load over a larger area, and not being capable of fracturing the oxide layer in order to make reliable electrical contact with the conductor.

It is an object of this invention to mitigate this problem.

From one aspect the present invention consists in a method of forming an anisotropic electrical connection between first and second substrates each having a plurality of adjacent conductive elements mounted thereon, at least some of the conductive elements having a non-conductive coating, the method comprising the steps of: aligning the substrates such that at least some of the conductive elements on the first substrate overlie a respective conductive element on the second substrate, and sandwiching between the substrates a substance comprising an insulating adhesive and a plurality of electrically conductive particles, some of the particles being capable of penetrating the conductive elements having a non-conductive coating by piercing the coating, and some of the particles being capable of deforming between the overlying elements, on the application of pressure between the substrates, and applying pressure between the substrates such that the substance forms an electrical connection between the overlying elements whilst isolating the adjacent elements from each other.

From another aspect the invention consists in an electrically interconnected assembly comprising first and second substrates each having a plurality of adjacent conductive elements mounted thereon, at least some of the conductive elements having a non-conductive coating, and being aligned such that at least some of the conductive elements on the first substrate each overlie a respective conductive element on the second substrate, and a substance including an adhesive bonding the substrates together, the substance forming an electrical connection between the overlying elements whilst isolating the adjacent elements from each other, and the substance including electrically conductive particles, some of which have pierced the non-conductive coating and penetrated the conductive element and some of which have deformed between the overlying elements.

The elements having a non-conductive coating may be of a metal which forms a stable oxide, for example, aluminium. Particles capable of piercing aluminium oxide have been found to include carbon fibres, disilicides, titanium diboride and tungsten whiskers.

The deformable particles may be metallic; for example, gold plated nickel. The adhesive base is conveniently a polymer base, or may be, for example, of chemically bonded ceramics such as magnesium-aluminium phosphates.

From yet another aspect, the invention consists in a substance comprising an adhesive polymer base, carbon fibres and metallic particles.

Figure 2:
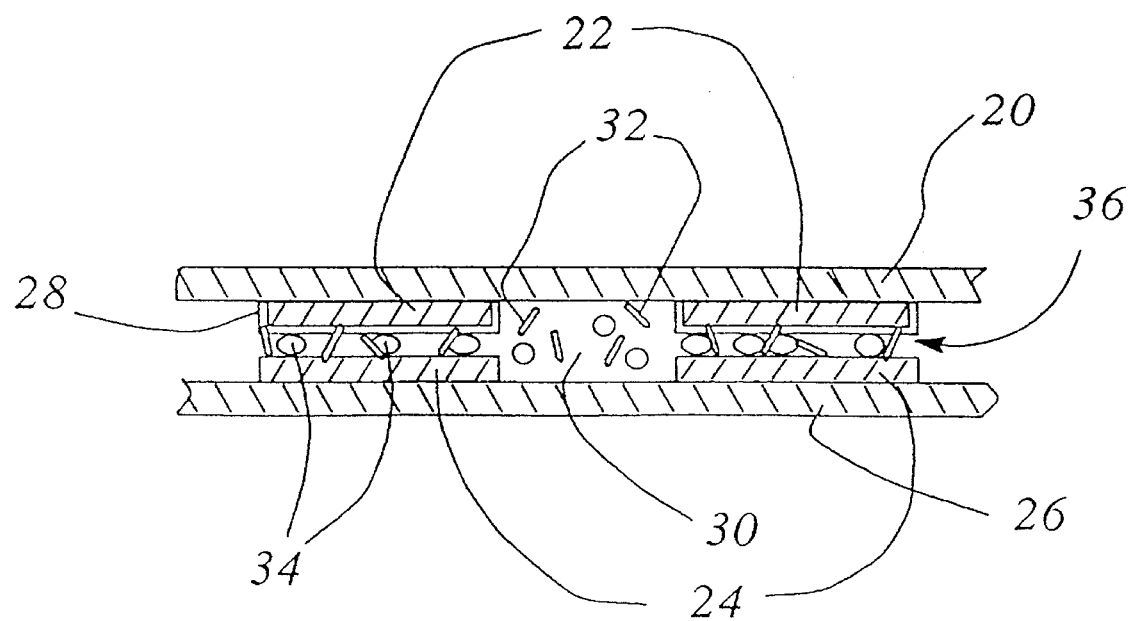

The invention will now be described, by way of example, with reference to the accompanying diagrammatic drawings, which are not to scale, and in which:

FIG. 1 is a cross-sectional view of an assembly according to the prior art, as already referred to above; and FIG. 2 is a cross-sectional view of an assembly according to the invention.

Referring to FIG. 2, it is required to connect first aluminium conductive elements 22 at the edge of a first substrate, which forms a glass display panel 20 of an FLCD screen, to a circuit board for supplying driving voltages. This is achieved by joining the elements 22 to second conductive elements 24, for example, of copper, gold-plated copper, silver or carbon-loaded inks, which are carded by a second substrate 26 in the form of a flexible strip. It is necessary to connect each first element 22 to a respective overlying second element 24 without connecting the adjacent first elements 22 together, or connecting the adjacent second elements 24 together.

An anisotropically electrically conductive adhesive substance 30, which conveniently is supplied in the form of a film, is sandwiched between the substrate 20, 26, and heat and pressure are applied to the joint.

Referring to FIG. 2, the adhesive substance 30, which may comprise a polymer base, includes carbon fibres 32, and metallic particles 34, such as gold coated nickel particles.

The aluminium elements 22, 24, on the first substrate 20 have a non-conductive oxide coating 28. When the joint is made, the carbon fibres which are captured in the gaps 36 between respective overlying conductors 22, 24 pierce the oxide coating 28 and penetrate the bodies of the aluminium elements 22. The metallic particles, however, are squashed between the elements 22, 24.

The particles 32, 34 are in sufficient quantity that an electrical connection is made between overlying conductors 22, 24, but no such connection is made between adjacent conductors 22 or 24. For instance, in the gap 36 between overlying conductors 22, 24 come carbon fibres 32 may penetrate the oxide layers 28 of the first element 22, and also contact the second element 24. Alternatively some fibres 32 which penetrate a first element 22 may contact a metallic particle 34, which contacts the second element 24.

With conductive elements having a pitch of about 1 mm, and a depth of about 0.0002 mm, carbon fibres having an average length of about 0.05 mm have been found to be suitable.

I claim:

1. An electrically interconnected assembly comprising first and second substrates each having a plurality of adjacent conductive elements mounted thereon, at least some of the conductive elements having a non-conductive coating, and being aligned such that at least some of the conductive elements on the first substrate each overlie a respective conductive element on the second substrate, and a substance including adhesive bonding the substrates together, the substance forming an electrical connection between the overlying elements whilst isolating the adjacent elements from each other, and the substance including electrically conductive particles some of which have a first composition and have pierced the non-conductive coating and penetrated the conductive element, and some of which have a second composition different from said first composition and have deformed between the overlying elements.

2. An assembly as claimed in claim 1, wherein the elements having a non-conductive coating are of a metal which forms a stable oxide coating.

3. An assembly as claimed in claim 1, wherein the particles piercing the non-conductive coating are fibrous particles.

4. An assembly as claimed in claim 1, wherein the particles piercing the non-conductive coating are non-metallic.

5. An assembly as claimed in claim 1, wherein the particles piercing the non-conductive coating are carbon fibers.

6. An assembly as claimed in claim 1, wherein the conductive particles deformed between the overlying elements are metallic.

* * * * *